Feb. 14, 1961 F. G. MASON 2,972,049

CHANGEOVER SWITCH ARRANGEMENT FOR VHF-UHF TUNER

Filed Feb. 17, 1959

INVENTOR.
FRANCIS G. MASON
BY
Ooms, McDougall, Williams & Hersh
ATTORNEYS

United States Patent Office 2,972,049

Patented Feb. 14, 1961

2,972,049

CHANGEOVER SWITCH ARRANGEMENT FOR VHF-UHF TUNER

Francis G. Mason, Weston, Conn., assignor to Aladdin Industries, Incorporated, Nashville, Tenn., a corporation of Illinois Filed Feb. 17, 1959, Ser. No. 793,857

1 Claim. (Cl. 250—40)

This invention relates to tuners for radio or television frequencies, and pertains particularly to tuners adapted to cover the commercial very high frequency (VHF) and ultrahigh-frequency (UHF) television bands.

One object of the present invention is to provide a new and improved all-band television tuner utilizing a VHF tuner and a UHF converter mounted thereon, with a changeover switch arrangement mounted on the UHF converter, but operated by a component of the VHF tuner.

A further object is to provide a new and improved tuner of the foregoing character in which the changeover switch is operated by a cam or the like mounted on the main channel selector shaft of the VHF tuner, the shaft being arranged to have the usual VHF channel settings plus an extra changeover position, in which the UHF tuner is activated.

Another object is to provide a new and improved tuner of the foregoing character in which virtually all of the cost of the VHF-UHF changeover arrangement is assigned to the UHF converter, so that the VHF tuner may be used or sold separately, without being burdened with any substantial extra cost due to its adaptability for use with the UHF converter.

Further objects and advantages of the present invention will appear from the following description, taken with the accompanying drawings, in which.

Figure 1:
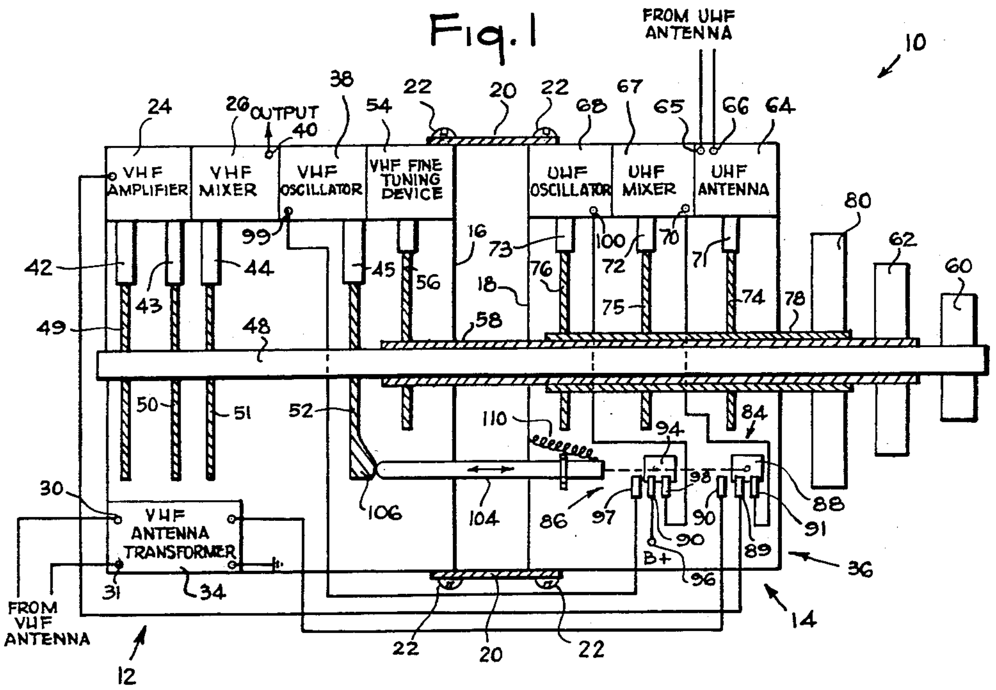
Fig. 1 is a diagrammatic view, partly in section, of a VHF-UHF tuner to be described as an illustrative embodiment of the present invention.

It will be seen that the drawings illustrate an all-band television tuner 10 utilizing a VHF tuner 12 and a UHF converter 14. Of course, the invention is applicable to other types of tuners or the like adapted to cover a plurality of bands, but it will be convenient to illustrate the invention in terms of an all-band television tuner.

The illustrated tuners 12 and 14 constitute distinct units. Thus, the VHF tuner 12 has a chassis or frame 16, while the UHF tuner 14 has a separate chassis 18. As shown, the UHF chassis 18 is disengageably mounted on the front of the VHF chassis 16. The chassis 18 may be secured to the chassis 16 by any suitable means, such as the illustrated tie plates 20, secured to the chassis by means of screws or the like 22.

Many details of the VHF tuner 12 are not strictly essential to the present invention, but nevertheless are of interest. Thus, the illustrated tuner 12 is of the superheterodyne type, having a radio frequency amplifier stage 24 and a mixer or converter stage 26. The input circuit of the amplifier stage 24 is represented by an input terminal 28. An antenna for the VHF band may be connected to a pair of antenna terminals 30 and 31 on the tuner 12. The terminals 30 and 31 are connected to the input of an antenna transformer 34. From the transformer 34, the signals from the antenna are routed to the input terminal 28 through a changeover switch 36, to be described in detail presently.

The radio frequency amplifier 24 merely amplifies the input signals and passes them on to the input of the mixer stage 26. The mixer stage 26 also receives the output of an oscillator 38 which produces a signal differing in frequency from the input signals by a fixed intermediate frequency. Thus, by the well-known superheterodyne effect, the mixer stage 26 produces an output at the intermediate frequency. This output is delivered at an output terminal 40, which may be connected to an intermediate frequency amplifier, and thence to other components of a television receiver, not of particular interest to the present invention, and hence not illustrated.

The amplifier 24, the mixer 26, and the oscillator 38 are equipped with variable tuning devices 42, 43, 44 and 45, so that their operating frequencies may be varied to cover the twelve channels of the VHF television band. The tuning devices 42–45 may be of any desired or suitable construction. They are shown as movable members adapted to vary the operating frequency of the tuner 12. Thus, the tuning devices 42 and 43 vary the tuning of the input and the output circuits of the amplifier 24, while the tuning device 44 varies the tuning of the input circuit for the mixer 26. The tuning device 45 is adapted to vary the operating frequency of the oscillator 38.

In this case, the variable tuning devices 42–45 are ganged together for simultaneous operation by means of a main tuning or channel selector shaft 48 having cams 49, 50, 51 and 52 thereon for operating the respective tuning devices 42–45. The shaft 48 extends forwardly from the VHF chassis 16, and is illustrated as passing through the UHF tuner 14 as will be described in greater detail shortly.

In order that each television channel may be tuned in with a high degree of precision, the VHF tuner 12 is equipped with the usual fine tuning device 54, adapted to vary the frequency of the oscillator 38 over a small range. The fine tuning device 54 is arranged to be operated by a cam 56 on a separate VHF fine tuning shaft 58, which is shown as a hollow shaft received coaxially around the channel selector shaft 48. Coaxial operating knobs 60 and 62 may be secured to the front ends of the shafts 48 and 58.

The UHF converter 14 is also of the superheterodyne type. Thus, it comprises an antenna stage 64 having input terminals 65 and 66 adapted to receive UHF signals from a separate UHF antenna. The output of the antenna stage 64 goes to a mixer stage 67, which also receives the output of an oscillator 68, so that the output signals from the mixer will be at the intermediate frequency. The output of the mixer is delivered at an output terminal 70. The antenna stage 64, the mixer 67, and the oscillator 68 are provided with variable tuning devices 71, 72 and 73, which may be of any suitable type. In this case, the tuning devices 71, 72 and 73 take the form of movable members operated by cams 74, 75 and 76 on a UHF tuning shaft 78. As shown, the shaft 78 is hollow and is coaxially received around the fine tuning shaft 58. An operating knob 80 may be secured to the front end of the shaft 78.

In the illustrated construction, the changeover switch 36 forms a part of the UHF converter 14. The switch 36 has a VHF position and a UHF position. In the VHF position the VHF tuner 12 is fully activated, while the UHF tuner is rendered inactive. In the UHF position, the UHF tuner 14 is activated, while the VHF tuner is rendered incapable of handling signals in the VHF band.

While the VHF tuner might be rendered totally inactive for UHF operation, it is often convenient to employ the amplifier and mixer stages 24 and 26 as extra intermediate frequency amplifiers for UHF reception. To achieve this mode of operation, the amplifier and mixer stages 24 and 26 are tuned to the intermediate frequency, while the oscillator 38 is disabled.

Thus, the illustrated changeover switch 36 comprises two units or sets of contacts 84 and 86. For VHF operation, the contacts 84 connect the input terminal 28 of the amplifier 24 to the output of the VHF antenna transformer. At the same time, the contacts 86 supply power to the VHF oscillator 38, while disconnecting the supply of power to the UHF oscillator 68. For UHF reception, the contacts 84 connect the input terminal 28 to the output terminal 70 of the UHF mixer 64. Simultaneously, the contacts 86 supply power to the UHF oscillator 68, while cutting off the supply of power to the VHF oscillator 38.

Various contact arrangements may be employed to achieve this mode of operation. As shown, the contacts 84 comprise a movable bridging contact 88 which continuously engages a fixed contact 89. The contact 88 is engageable alternately with contacts 90 and 91. It will be seen that the contact 89 is connected to the VHF input terminal 28, while the contact 90 is connected to the output of the VHF antenna transformer 34. The contact 91 is connected to the output terminal 70 of the UHF tuner 14. In the VHF position of the switch 36, the contact 88 bridges the contacts 89 and 90, and thereby connects the VHF input terminal to the antenna transformer 34. In the UHF position, the contact 88 bridges the contacts 89 and 91 so as to connect the input terminal 28 to the output terminal 70.

Similarly, the switch unit 86 comprises a movable bridging contact 94 which continuously engages a fixed contact 95. This contact is connected to a power supply terminal 96. The movable contact 94 is alternatively engageable with contacts 97 and 98, which are connected to power input terminals 99 and 100 on the VHF oscillator 38 and the UHF oscillator 68. In the VHF position, the power supply terminal 96 is thus connected to the VHF oscillator 38. For UHF reception, the power supply terminal 96 is connected to the UHF oscillator 68.

As already indicated, the VHF channel selector shaft 48 may have the usual channel positions for the twelve VHF television channels plus an additional position for UHF reception. The construction of the tuning elements 42, 43 and 44 is such that they are tuned to the intermediate frequency when the shaft 48 is in the UHF position.

Figure 2:
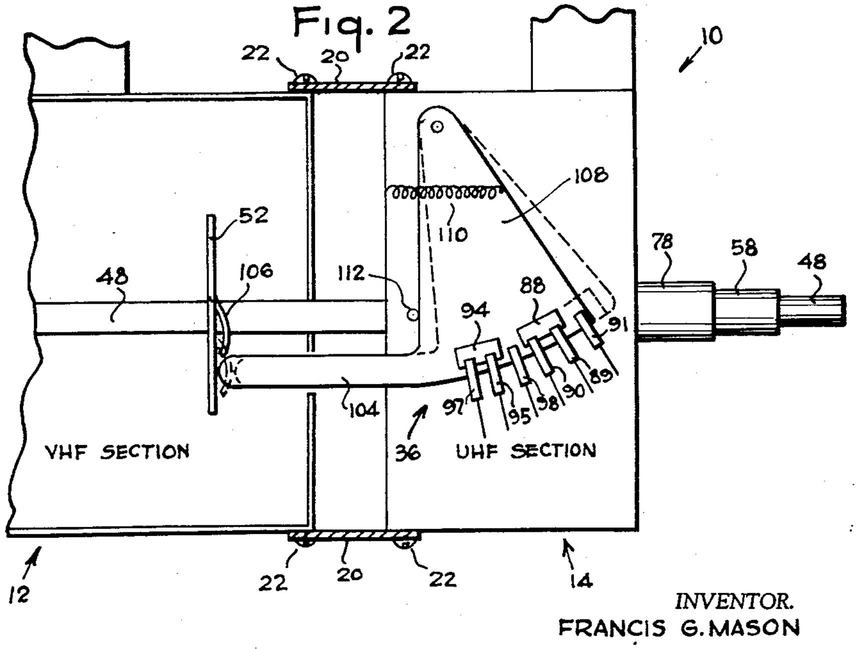
Fig. 2 is a somewhat diagrammatic, elevational, sectional view showing further details of the illustrative tuner.

While the changeover switch 36 is on the UHF tuner 14, it is arranged to be operated by the VHF channel selector shaft 48. In the illustrated construction, this is accomplished by providing the changeover switch 36 with an operating member 104 which extends between the UHF tuner 14 and the VHF tuner 12. Means are provided on the VHF channel selector shaft 48 to shift the operating member 104 to the UHF position when the shaft is rotated to its UHF changeover position. In the illustrated construction, the switch operating member 104 is actuated by an extra cam element 106 connected to the channel selector shaft 48. It is convenient to form the cam element 106 as an extra lobe on one of the tuning cams 49–52. In this case, the extra cam lobe 106 is formed as a projection from one face of the oscillator cam 52. As shown to advantage in Fig. 2, the switch operating member 104 may be connected to a pivoted sector 108 which carries the movable contacts 88 and 94. A spring 110 may be provided to bias the sector 108 in a direction such as to move the member 104 toward the cam 52. In the UHF position of the shaft 48, the lobe 106 engages the member 104 and swings the switch sector 108 to its UHF position. A suitable stop 112 may be provided to limit the movement of the sector 108 toward the cam 52.

It will be evident that the VHF tuner 12 is adapted to be used independently of the UHF converter 14. Moreover, the extra cam lobe 106 constitutes the only element of the VHF tuner 12 which needs to be provided to adapt the tuner 12 for use with the UHF converter 14. In many geographical areas, there is an adequate number of VHF television broadcast stations. For such areas, it is usually quite sufficient to provide the television receivers with only the VHF tuner. In fact, it is generally not worthwhile economically to supply the UHF converter.

Of course, there are other geographical areas which are not adequately served by VHF television stations, but which are covered by UHF stations. For these areas, it is necessary to equip the television receivers with both the VHF tuner 12 and the UHF converter 14. The changeover switch 36 is needed only when the UHF converter 14 is supplied. In the illustrated construction, the changeover switch 36 is a component of the UHF converter, so that the cost of the switch is borne by the UHF converter 14. Thus, the cost of the changeover switch does not burden the VHF tuner 12, when sold separately. Nevertheless, the changeover switch is conveniently arranged for operation by the VHF channel selector switch. This is highly desirable so as to minimize the number of control knobs. It will be recognized that the present invention may be employed on various types of multiband tuners at extremely low cost.

Various modifications, alternative constructions and equivalents may be employed without departing from the true spirit and scope of the invention, as exemplified in the foregoing description and defined in the following claim.

I claim:

In a unit for tuning a television receiver or the like, the combination comprising a first tuner for covering a first frequency band, said first tuner having a first chassis with variable tuning means thereon, a first tuning shaft rotatably mounted on said first chassis for operating said tuning means, said shaft extending forwardly from said first chassis, a second tuner having a second chassis with variable tuning means thereon for covering a second frequency band, a hollow tuning shaft rotatably mounted on said second chassis for operating said second tuning means, means securing said second chassis to the front of said first chassis, said first tuning shaft extending coaxially through said hollow tuning shaft, said first tuning shaft being rotatable to a plurality of channel positions and an additional changeover position, said second tuner comprising a switch mounted on said second chassis and movable between first and second positions, said switch being effective in said first position to activate said first tuner while being effective in said second position to activate said second tuner, said switch having an operating member movable forwardly and rearwardly and projecting rearwardly from said second tuner to said first tuner, and a cam on said first tuning shaft of said first tuner, said cam having a forwardly projecting cam lobe thereon engageable with said operating member of said switch and effective to shift said switch between said first and second positions when said first shaft is moved into said changeover position.

References Cited in the file of this patent

UNITED STATES PATENTS

| | | |
|---|---|---|
| 2,773,177 | Witte | Dec. 4, 1956 |
| 2,824,957 | Meadows | Feb. 25, 1958 |
| 2,832,891 | Lyman | Apr. 29, 1958 |
| 2,853,882 | Mason | Sept. 30, 1958 |
| 2,873,360 | Lyman | Feb. 10, 1959 |